US007708868B2

(12) United States Patent
Smathers et al.

(10) Patent No.: US 7,708,868 B2
(45) Date of Patent: May 4, 2010

(54) VARIABLE THICKNESS PLATE FOR FORMING VARIABLE WALL THICKNESS PHYSICAL VAPOR DEPOSITION TARGET

(75) Inventors: David B. Smathers, Columbus, OH (US); Melvin K. Holcomb, Grove City, OH (US); Eric Land, Columbus, OH (US)

(73) Assignee: Tosoh SMD, Inc., Grove City, OH (US)

( * ) Notice: Subject to any disclaimer, the term of this patent is extended or adjusted under 35 U.S.C. 154(b) by 951 days.

(21) Appl. No.: 11/443,232

(22) Filed: May 30, 2006

(65) Prior Publication Data

US 2007/0007131 A1    Jan. 11, 2007

Related U.S. Application Data

(60) Provisional application No. 60/697,501, filed on Jul. 8, 2005.

(51) Int. Cl.
*B23K 20/00* (2006.01)
*B21D 22/16* (2006.01)
*C23C 14/32* (2006.01)

(52) U.S. Cl. ............... 204/298.12; 204/298.09; 204/298.13; 219/121.14; 72/57; 72/347

(58) Field of Classification Search ............. 72/54, 72/57, 60; 204/298.09, 298.12, 298.13, 298.14; 219/121.14

See application file for complete search history.

(56) References Cited

U.S. PATENT DOCUMENTS 2,767,466 A * 10/1956 Faulkner ................. 72/377

| 4,049,533 | A |   | 9/1977  | Golyanov et al. |
|-----------|---|---|---------|-----------------|
| 4,209,375 | A |   | 6/1980  | Gates et al. |
| 4,966,676 | A |   | 10/1990 | Fukasawa et al. |
| 5,009,765 | A | * | 4/1991  | Qamar et al. ........ 204/298.12 |
| 5,143,590 | A | * | 9/1992  | Strothers et al. ....... 204/298.12 |
| 5,215,639 | A |   | 6/1993  | Boys |
| 5,282,943 | A | * | 2/1994  | Lannutti et al. ........ 204/192.12 |
| 5,687,600 | A | * | 11/1997 | Emigh et al. .................. 72/69 |
| 5,911,858 | A |   | 6/1999  | Ruffner |
| 6,073,830 | A |   | 6/2000  | Hunt et al. |
| 6,113,985 | A |   | 9/2000  | Suscavage et al. |
| 6,164,519 | A |   | 12/2000 | Gilman et al. |
| 6,419,806 | B1|   | 7/2002  | Holcomb et al. |
| 6,485,542 | B2|   | 11/2002 | Shindo et al. |
| 6,500,321 | B1|   | 12/2002 | Ashtiani et al. |
| 6,599,405 | B2|   | 7/2003  | Hunt et al. |
| 6,668,207 | B1|   | 12/2003 | Montcalm et al. |

(Continued)

*Primary Examiner*—David B Jones
(74) *Attorney, Agent, or Firm*—Wegman, Hessler & Vanderburg

(57) ABSTRACT

A variable thickness sputtering target which increases the target material thickness at strategic locations to greatly improve the yield of usable wafers per target, and a method of manufacturing such target comprising forming a generally flat and circularly shaped target blank so that a thickness dimension between the top and bottom surfaces decreases as a function of radius of the target blank. The variable thickness target blank is then formed into a variable thickness dome shaped target member having a bottom portion and a sidewall portion, wherein a wall thickness of said variable thickness dome-shaped target member is thickest proximate a center portion of said bottom portion. In one embodiment of the invention, the variable thickness target blank is formed by clock rolling (or compression rolling) the target blank with crowned rolls to obtain a variable thickness target blank.

13 Claims, 4 Drawing Sheets

U.S. PATENT DOCUMENTS

| | | |
|---|---|---|
| 6,797,362 B2 | 9/2004 | Parfeniuk et al. |
| 7,297,247 B2 * | 11/2007 | Subramani et al. ........... 205/149 |
| 7,334,479 B2 * | 2/2008 | Leybovich ................... 73/620 |
| 7,431,195 B2 * | 10/2008 | Facey et al. ................. 228/164 |
| 7,480,976 B2 * | 1/2009 | Reed et al. .................... 29/563 |
| 2002/0134675 A1 * | 9/2002 | Holcomb et al. ........ 204/298.12 |
| 2004/0000478 A1 | 1/2004 | Guenzer |
| 2004/0141870 A1 | 7/2004 | Michaluk et al. |
| 2005/0167015 A1 | 8/2005 | Pard et al. |
| 2005/0279630 A1 * | 12/2005 | Fonte .................... 204/298.21 |

* cited by examiner

VARIABLE THICKNESS PLATE FOR FORMING VARIABLE WALL THICKNESS PHYSICAL VAPOR DEPOSITION TARGET

CROSS REFERENCE TO RELATED APPLICATION

This application claims the benefit of U.S. Provisional Patent Application No. 60/697,501, filed Jul. 8, 2005.

FIELD OF THE INVENTION

The present invention relates generally to sputtering systems and, more particularly, to a system and method for producing a variable thickness sputtering target for use in a sputtering system.

BACKGROUND OF THE INVENTION

Cathodic sputtering is widely used for depositing thin layers or films of materials from sputter targets onto substrates. Basically, a cathode assembly including the sputter target is placed together with an anode in a chamber filled with an inert gas, preferably argon. A substrate is positioned in the chamber near the anode with a receiving surface oriented normal to a path between the cathode assembly and the anode. A high voltage electric field is applied across the cathode assembly and the anode causing electrons to eject from the cathode assembly and ionize the inert gas. The positively charged ions of the inert gas are then propelled against a sputtering surface of the sputter target due to the electric field. The ion bombardment against the sputtering surface of the target causes portions of the material of the sputtering surface to dislodge from the sputter target surface and deposit as a thin film or layer on the receiving surface of the substrate at an opposite end of the chamber.

Sputtering targets are typically formed as a generally circular disk of target material, such as aluminum, gold, silver, tantalum, copper, titanium, tungsten or platinum and alloys thereof. The disk of target material may be soldered or otherwise bonded to a supporting target backplate to form a replaceable sputtering target assembly. During the sputtering operation, material is sputtered from the top surface of the target and deposited on the wafer. The sputtering material typically erodes unevenly across the width or face of the target exposed to the wafer, with some areas of the target eroding more quickly than other areas.

Recently, non-planar sputter targets have been developed to provide improved sputtering and deposition uniformity. For example, open-ended cup-shaped hollow cathode magnetron (HCM) sputter targets have been developed, as disclosed in U.S. Pat. No. 6,419,806 of common assignment herewith, the disclosure of which is incorporated herein by reference. These cup or dome shaped targets are generally comprised of a high purity metallic material as the target surface and they are typically formed from well-known metal-working operations such as hydroforming. The closed end of the cup-shaped target comprises a dome. Sidewalls extend from the dome to an open end of the target.

Typically, these cup or dome shaped targets experience the most target material consumption (i.e., erosion) in the dome area with the corner areas that connect the dome to the sidewalls also experiencing considerable erosion but less than that in the dome area. The sidewall areas of the cup shaped target usually experience the least amount of target erosion.

SUMMARY OF THE INVENTION

The present invention provides a variable thickness cup shape sputtering target which increases the target material thickness at strategic high erosion locations to greatly improve the yield of usable wafers per target. A method of manufacturing a variable wall thickness sputtering target comprises forming a target blank of sputtering material having a top surface, a bottom surface, and a substantially circular outer peripheral surface, and forming the top and bottom surfaces so that a thickness dimension between the top and bottom surfaces decreases as a function of radius of the target blank, wherein the blank is thinner proximate the edge and thicker proximate the center. The variable thickness target blank is then formed into a variable thickness dome shaped target member having a top or dome portion and a sidewall portion, wherein the wall thickness of the dome-shaped target member is thickest proximate the center of the dome portion.

In one embodiment of the invention, the variable thickness target blank is formed by clock rolling (or compression rolling) the target blank with crowned rolls to obtain a variable thickness target blank. In another embodiment of the invention, the variable thickness target blank is formed by pressing an outer edge portion of the target blank to make it thinner than an inner, central portion of the target blank. In yet another embodiment of the invention, the target blank is formed by welding a thicker center region of sputtering material into a thinner generally annular shaped outer region of sputtering material, thereby forming a variable thickness blank. The variable thickness target blank is then formed into a variable thickness dome-shaped target member for example by hydroforming, wherein the dome portion of the target member is thicker than the side wall portions.

While the invention will be described in connection with certain embodiments, it will be understood that the invention is not limited to these embodiments. On the contrary, the invention includes all alternatives, modifications and equivalents as may be included within the spirit and scope of the present invention.

DETAILED DESCRIPTION OF THE INVENTION

The present invention provides a method of making a sputtering target. The method includes providing a sputtering target workpiece blank comprising a high purity metallic material at the target surface. Preferably the target is a dome-shaped (or cup-shaped) hollow cathode magnetron (HCM) sputter targets, as disclosed in U.S. Pat. No. 6,419,806 of common assignment herewith, the disclosure of which is incorporated herein by reference.

Figure 1:
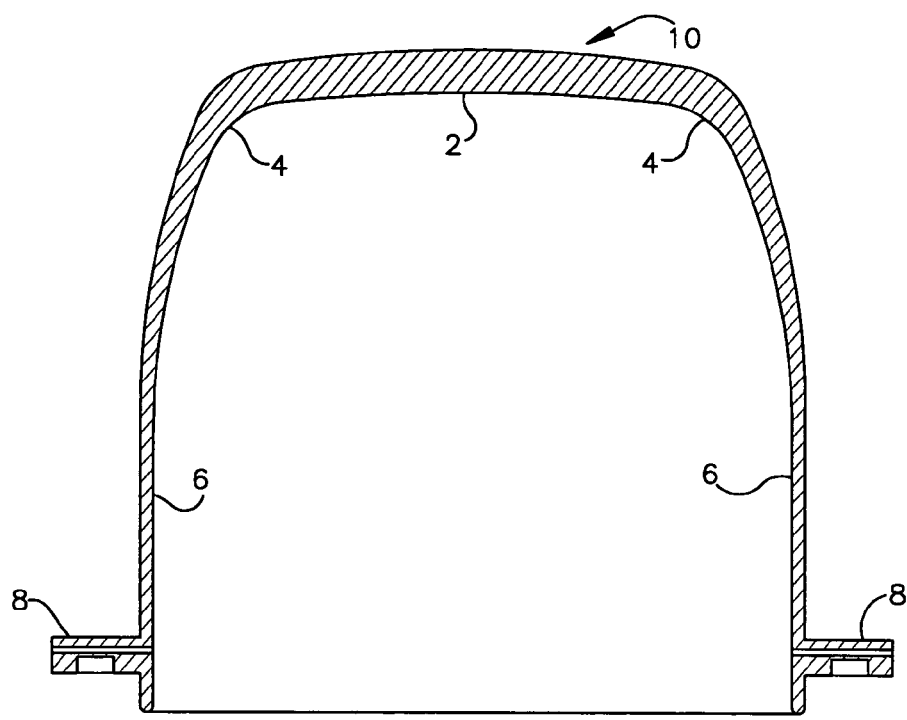
FIG. 1 is a cross-sectional view of a sputtering target made in accordance with the present invention.
Figure 2:
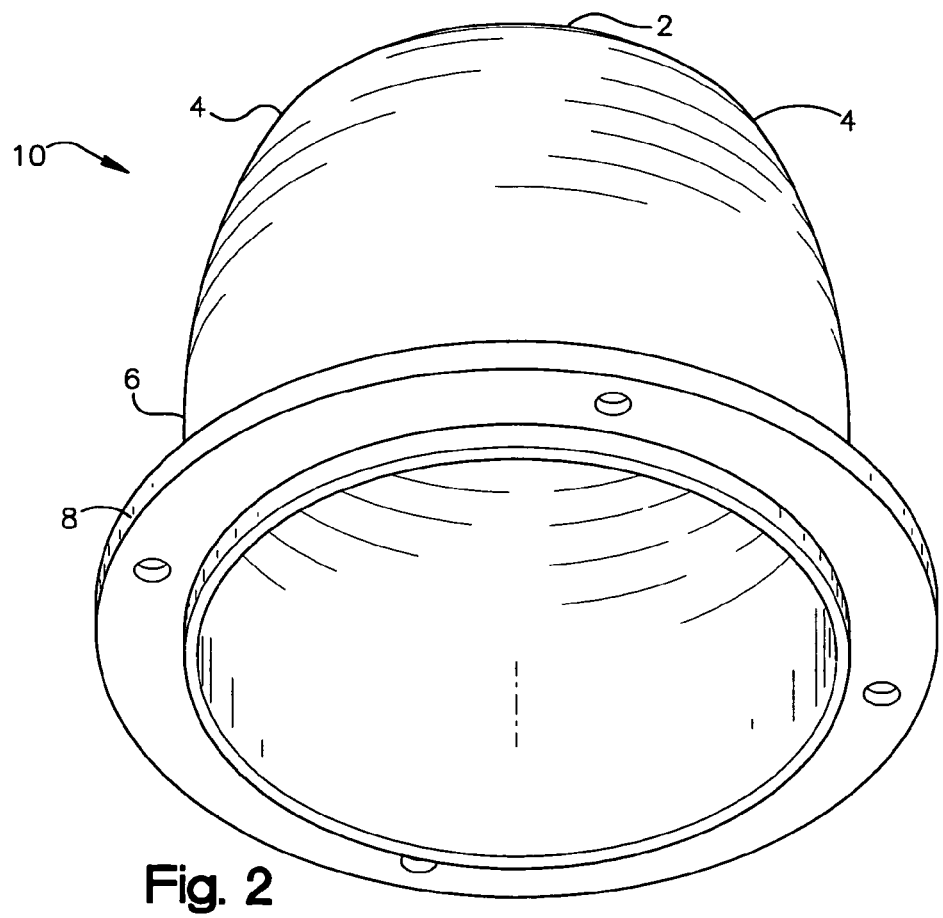
FIG. 2 is a perspective view of the sputtering target of FIG. 1.
Figure 4:
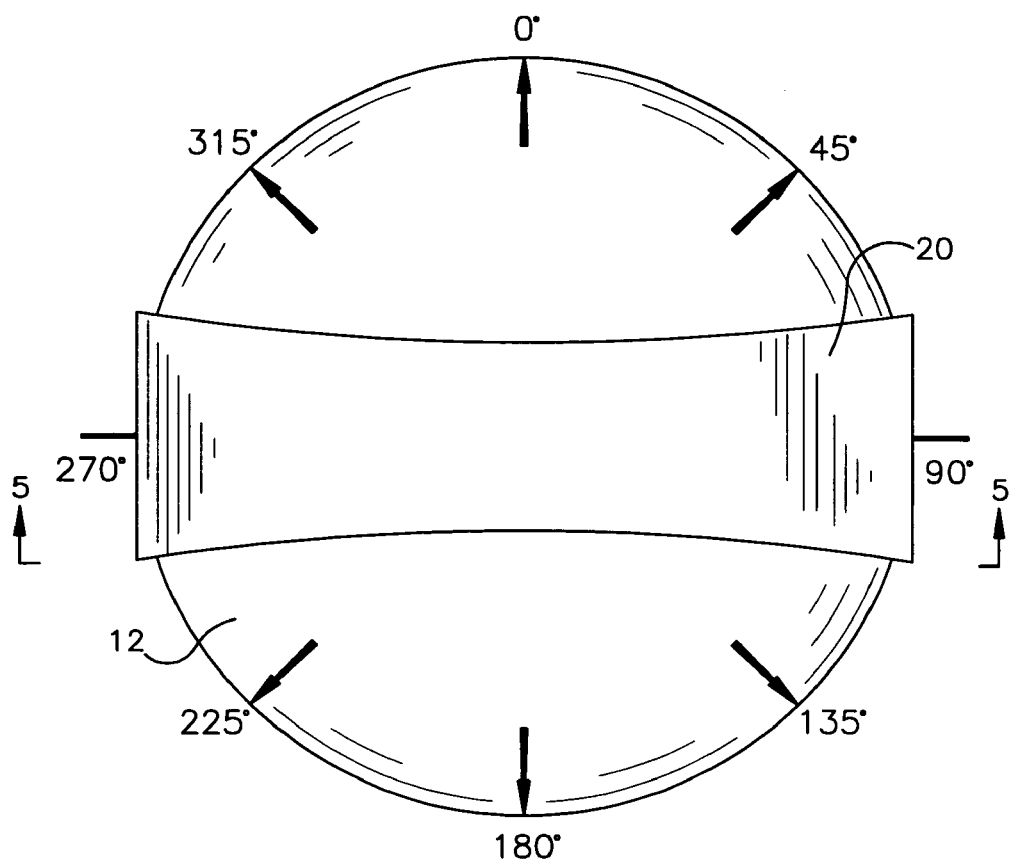
FIG. 4 is a schematic top plan representation of the step of clock rolling a target blank according to a method of the present invention.
Figure 5:
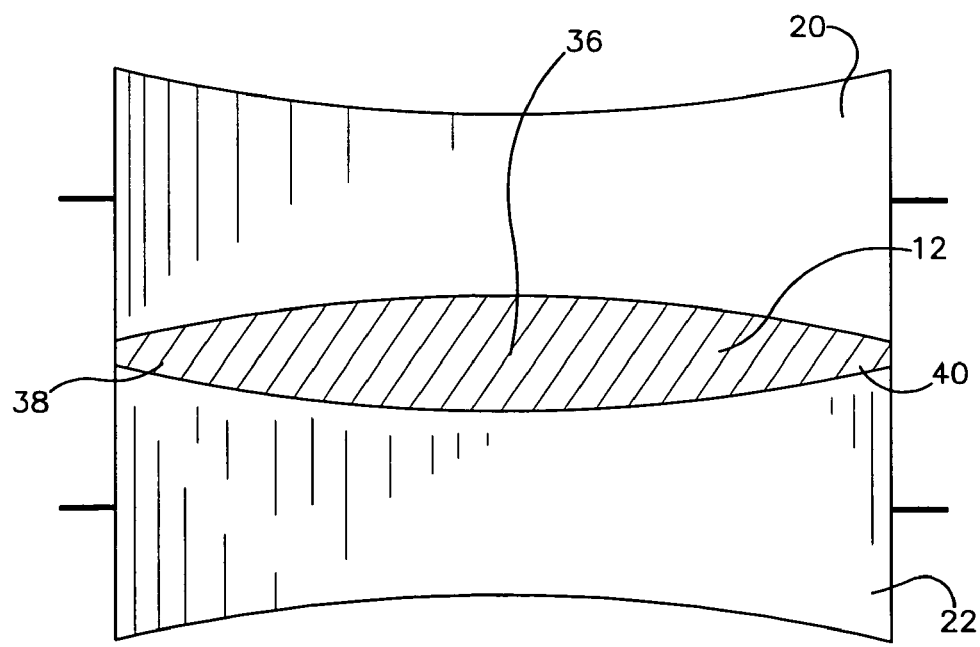
FIG. 5 is a cross sectional view of the schematic of FIG. 4 taken along the plane indicated by the lines and arrows 5-5 of FIG. 4.

Referring to FIG. 1, there is shown a cross-sectional view of an exemplary variable thickness sputter target 10 according to the present invention. For clarity, FIG. 2 illustrates a perspective view of the dome-shaped variable thickness target of FIG. 1 As shown in FIGS. 1 and 2, the variable thickness sputter target 10 is in the form of a hollow dome or cup comprising sidewalls 6, corners 4, mounting flanges 8, and a top or dome portion 2. As stated above, quite typically, the life of the target is limited by the target area that experiences the most erosion. In these cup shaped configurations, the most erosion is seen in the area of the dome 2 with the corners 4 that connect the dome to the sidewalls 6 eroding more than the sidewalls but less than the dome. The sputter target 10 is typically formed from a generally flat and circularly shaped target blank 12 as best shown in FIGS. 4 and 5.

Figure 3A:
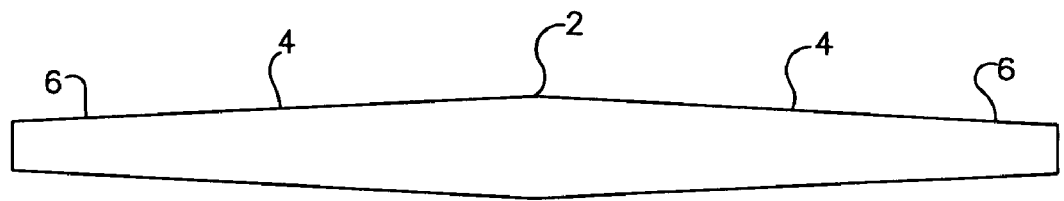
FIG. 3A is a cross-sectional view of a variable thickness target blank made in accordance with an exemplary embodiment of the present invention.

In order to enhance the yield of a variable wall thickness dome-shaped sputtering target 10 having a thicker dome section 2, it is desirable to form the target from a target blank 14 having a variable wall thickness as shown in FIG. 3A. This can be accomplished by clock rolling (sometimes referred to as compression rolling) a flat target blank 12 on a mill with crowned rolls 20, 22 as shown in FIGS. 4 and 5. As shown, the surfaces of the rollers are crowned so that the distance between the roller surfaces at the center 36 of the nip is greater than that at the lateral borders of the rollers 38, 40. In one embodiment, a generally circular shaped target blank 12 is provided. Thereafter, the target blank 12 is clock rolled at a variety of different angular orientations to obtain a variable thickness target blank. The rolled target blank is then water jet cut around the periphery to obtain a generally circularly shaped target blank 12.

In one exemplary clock rolling process, the finished blank ingot size is approximately 34 inches diameter by 0.410 inches thick at the edge 6 and 0.430 inches thick toward the center region 2. The starting ingot size is approximately six inches diameter by 13.250 inches. A sequence of sixteen roller passes are scheduled at different angular orientations with about an 11.63 percentage reduction per pass. In addition, three small passes (numbered 17-19 in the Table 1 below) are used to obtain the desired diameter. The sequence orientation and thickness parameters for each pass are summarized in Table 1 below.

TABLE 1

| Pass No. | Dimension | Angular Orientation |
|---|---|---|
| 1 | 2.747 | 0° |
| 2 | 2.435 | 90° |
| 3 | 2.159 | 180° |
| 4 | 1.913 | 270° |
| 5 | 1.696 | 45° |
| 6 | 1.503 | 135° |
| 7 | 1.332 | 225° |
| 8 | 1.181 | 315° |
| 9 | 1.047 | 30° |
| 10 | 0.928 | 120° |
| 11 | 0.822 | 210° |
| 12 | 0.729 | 300° |
| 13 | 0.646 | 75° |
| 14 | 0.573 | 165° |
| 15 | 0.508 | 255° |

TABLE 1-continued

| Pass No. | Dimension | Angular Orientation |
|---|---|---|
| 16 | 0.450 | 345° |
| 17 | 0.400 | |
| 18 | 0.380 | |
| 19 | 0.370 | |

Figure 6:
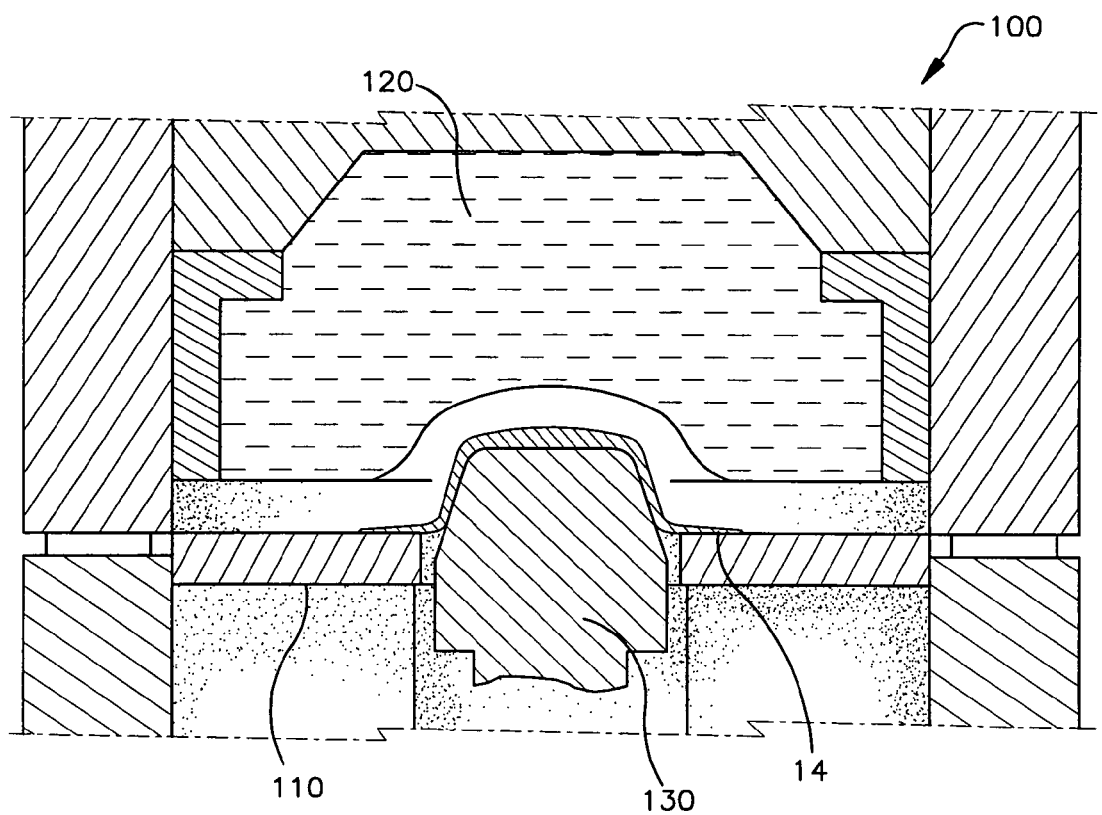
FIG. 6 illustrates a schematic diagram of a hydroforming press that may be used in accordance with the invention.

Thereafter, in one exemplary embodiment the variable thickness round target blank is placed on a mandrel of the type shown in FIG. 6 and hydroformed to make a dome-shaped target of the type shown in FIG. 2. Minimal wall thinning occurs. The thickest regions of the original flat plate remain thickest after the forming operation. Some wall thickening or thinning can be managed by the forming process. As described above, the finished part is radially symmetric, but the thickness is radius dependent; that is, the plate is thickest proximate the center and thinnest proximate the edge.

Turning to the FIG. 6 of the drawings, there is shown a hydroforming press of the type that may be used to form the variable wall thickness cup shaped target of the invention. The variable wall thickness blank 14 such as that shown in FIG. 3A is placed over a suitable configured mandrel or punch 130 surrounded by platen 110 in the hydroforming press 100. A bladder 120 is filled with hydraulic fluid and is positioned in the housing above the variable wall thickness blank 14. As the artisan will appreciate, the mandrel or punch 130 is configured so as to be congruent with and to form the desired cup shaped target.

In practice, the housing is lowered to contact the bladder with the upper surface of the blank. Thereafter, the mandrel is urged upwards through the opening in the annular platen and against a lower surface of the blank. As the mandrel continues to press upwards against the blank, the upper surface of the blank is urged against the bladder. At the same time, the pressure in the bladder increases up to as much as about 10,000 psi. Thus, as the mandrel urges the blank upwards, the pressurized bladder provides resistance until the blank is made to conform to the shape of the mandrel. The mandrel and bladder are retracted and the target is removed from the hydroforming press, for example. The entire hydroforming process may take about 1.5 minutes and is preferably performed at room temperature. Because the process is performed at room temperature, heat induced crystallographic orientation changes of the target are minimized.

Other methods that may be used to make sputter targets from the variable thickness blanks such as to those shown in FIG. 3A include deep drawing or spinning to obtain a generally circularly symmetric target with a variable wall thickness, wherein the part is thickest near the center of the dome portion 2. By way of example and not by way of limitation, in one exemplary embodiment the wall thickness at the dome portion 2 can be between about 1.25 and about 4 times the thickness of the upper wall 6 in the finished dome-shaped target 10. There is some variability from source-to-source and target-to-target, but it is possible to calculate expected target life based on worse case erosion data at each of the areas of interest according to the equation:

current target life (kWh)=erodible material (mils)÷erosion rate (mils/kWh).

With hollow dome-shaped targets, we are primarily interested in calculating target life based on the erosion rates at three areas of interest:

1. the dome portion of the target;
2. the corner portion of the target; and
3. the sidewall portion of the target.

Exemplary maximum expected erosion rates have been found to be approximately 0.03 mils/kWh near the dome portion of the target, and approximately 0.02 mils/kWh near the corners of the target. Therefore, based on differing erosion rates at each location, we can calculate the optimum thickness required at each location to provide the desired target life in accordance with the above equation. Exemplary target life calculations are summarized in Table 2 below.

TABLE 2

|  | Target Life (kWh) | | | |
| --- | --- | --- | --- | --- |
|  | 5000 | 5800 | 7500 | 10,000 |
| DOME | 250 | 274 | 325 | 400 |
| CORNER | 225 | 241 | 275 | 325 |
| SIDEWALL | 200 | 216 | 250 | 300 |

Required thickness in each zone (mils).

As described above, hydroforming may also be used to form the desired cup shape target from the variable wall thickness precursor plate. Additionally, in that process a higher pressure could be provided around the sidewall of the target to therefore make it thinner relative to the base or dome portion of the target. Thus, the thinning of the sidewalls could be accomplished during the target shaping or forming step.

Figure 3B:
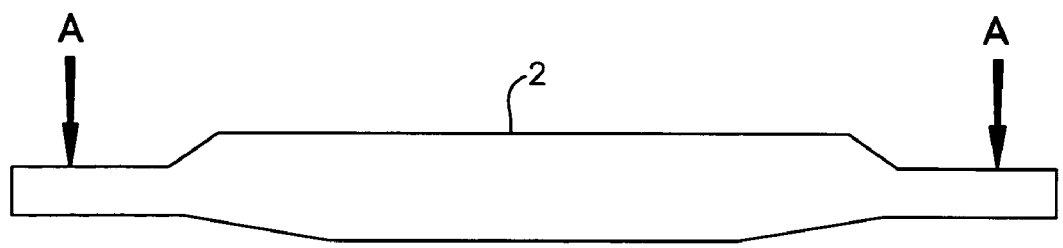
FIG. 3B is a cross-sectional view of a variable thickness target blank made in accordance with another exemplary embodiment of the present invention.

As shown in FIG. 3B, the present invention also contemplates forging or pressing the outer edge of the target blank 14B to make it thinner than the body of the target blank itself. In this way another variable thickness target blank 14A may be provided.

Figure 3C:
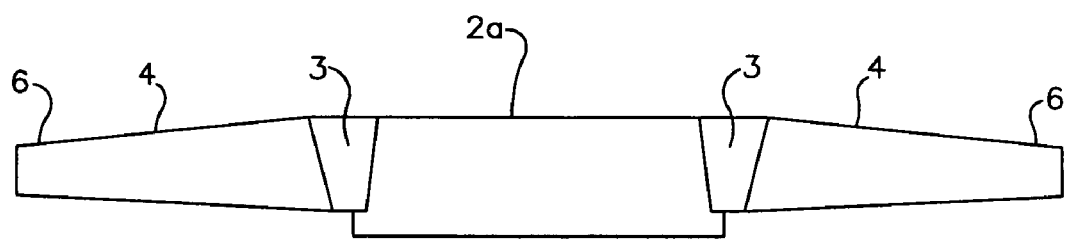
FIG. 3C is a cross-sectional view of a variable thickness target blank made in accordance with yet another exemplary embodiment of the present invention.

As another option, FIG. 3C illustrates a target blank 14C comprising a thick center region welded into a thinner annular region prior to the rolling operation so as to form a variable thickness welded target blank.

In an exemplary embodiment of the invention, the variable thickness target blanks are used to form a sputter target comprising a substantially cylindrical side wall portion, a generally annular dome portion, and an arcuate corner portion adjoining the side wall portion and the dome portion, thereby forming a substantially hollow dome-shaped target member, wherein the wall thickness of the dome portion is thicker than the wall thickness of the corner portion, and wherein the wall thickness of the corner portion is thicker than the wall thickness of the side wall portion. Such an exemplary variable thickness dome-shaped target member may also comprise a flange portion connected to the side wall portion, wherein the flange portion comprises a plurality of apertures for mounting the target member to the sputter reactor. In another exemplary embodiment, a variable thickness dome-shaped target member is provided wherein the thickness of the dome portion is between about 1.25 and about 4 times the thickness of the side wall portion.

While the methods herein described and the products produced by these methods constitute exemplary embodiments of this invention, it is to be understood that the invention is not limited to these precise methods and products, and that changes may be made in either without departing from the scope of the invention which is defined in the appended claims.

What is claimed is:

1. A method of manufacturing a variable wall thickness sputtering target, comprising:
  a. forming a target blank of sputtering material having a top surface and a bottom surface;
  b. forming said top and bottom surface so that a thickness dimension between said top and bottom surfaces varies as a function of radius of said target blank, thereby forming a variable thickness target blank;
  c. forming said variable thickness target blank into a variable thickness dome shaped target member having a dome portion and a sidewall portion, wherein a wall thickness of said dome-shaped target member is thickest proximate a center portion of said dome portion.

2. The method of claim 1, wherein said forming step (b) comprises clock rolling said top and bottom surface with crowned rolls.

3. The method of claim 1, wherein said forming step (b) comprises pressing an outer edge portion of said target blank to make it thinner than an inner portion of said target blank.

4. The method of claim 1, wherein said forming step (b) comprises pressing an inner portion of said target blank to make it thinner than an outer edge portion of said target blank.

5. The method of claim 1, further comprising welding a center region of sputtering material into a generally annular shaped outer region of sputtering material, thereby forming a variable thickness welded target blank.

6. The method of claim 1, wherein said forming step (c) comprises hydroforming said variable thickness target blank into said dome-shaped target member.

7. The method of claim 1, wherein said wall thickness proximate said center portion is between about 1.25 and about 4 times the wall thickness proximate an edge of said sidewall portion.

8. The method of claim 1, wherein said target blank is substantially circular in top plan.

9. The method of claim 1, wherein said target blank comprises a metal selected from the group consisting of Al, Au, Ag, Ta, Cu, Ti, W, and Pt and alloys thereof.

10. The method of claim 1, wherein said target blank comprises Ta.

11. A method of manufacturing a variable wall thickness sputtering target, comprising:
  a. forming a target blank of sputtering material having a top surface, a bottom surface, an edge portion and a central portion;
  b. forming said top and bottom surface so that a thickness dimension between said top and bottom surfaces is thicker near said central portion and thinner near said edge portion, thereby forming a variable thickness target blank;
  c. forming said variable thickness target blank into a variable thickness dome shaped target member having a dome portion and a sidewall portion, wherein a wall thickness of said dome-shaped target member is thicker near said dome portion and thinner near said sidewall portion.

12. The method of claim 10, wherein said wall thickness near a center of said dome portion is between about 1.25 and about 4 times said wall thickness near an edge of said sidewall portion.

13. A method of manufacturing a variable wall thickness sputtering target, comprising:
  a. forming a target blank of sputtering material having a top surface; a bottom surface, an edge portion, a middle portion and a central portion;
  b. forming said top and bottom surfaces so that a thickness dimension between said top and bottom surfaces is different near said central portion than said middle and/or outer portion, thereby forming a variable thickness target blank;
  c. forming said variable thickness target blank into a variable thickness dome shaped target member having a dome portion, corner portion and a sidewall portion, wherein a wall thickness of said dome-shaped target member is different near said dome portion than near corner and/or sidewall portion.

* * * * *